(12) United States Patent
Kaneda

(10) Patent No.: US 7,221,143 B2
(45) Date of Patent: May 22, 2007

(54) HALL IC TYPE CURRENT SENSOR OF VEHICLE-MOUNTED POWER CONVERTER

(75) Inventor: Naohito Kaneda, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/032,079

(22) Filed: Jan. 11, 2005

(65) Prior Publication Data
US 2005/0168210 A1 Aug. 4, 2005

(30) Foreign Application Priority Data
Jan. 29, 2004 (JP) .......................... P2004-021621

(51) Int. Cl.
*G01R 33/02* (2006.01)
(52) U.S. Cl. .............................. 324/117 H; 324/117 R; 324/127
(58) Field of Classification Search .................. None
See application file for complete search history.

(56) References Cited

U.S. PATENT DOCUMENTS

| | | | | |
|---|---|---|---|---|
| 4,482,849 A | * | 11/1984 | Doemen et al. ............ | 318/254 |
| 6,008,634 A | * | 12/1999 | Murofushi et al. ..... | 324/117 H |
| 6,305,338 B1 | * | 10/2001 | Kramer et al. ........... | 123/179.3 |
| 6,366,194 B1 | * | 4/2002 | Riehl et al. ................ | 338/32 H |
| 6,380,728 B1 | * | 4/2002 | Tareilus et al. .......... | 324/117 H |
| 6,414,474 B1 | * | 7/2002 | Gohara et al. ........... | 324/117 H |
| 6,426,617 B1 | * | 7/2002 | Haensgen et al. ....... | 324/117 H |
| 6,515,468 B1 | * | 2/2003 | Morimoto et al. ...... | 324/117 H |
| 6,611,137 B2 | * | 8/2003 | Haensgen et al. ....... | 324/117 H |
| 6,642,704 B2 | * | 11/2003 | Hastings et al. ......... | 324/117 H |
| 6,781,359 B2 | * | 8/2004 | Stauth et al. ............. | 324/117 H |
| 6,876,189 B2 | * | 4/2005 | Takatsuka et al. ....... | 324/117 H |
| 2004/0080308 A1 | * | 4/2004 | Goto ........................ | 324/117 H |

FOREIGN PATENT DOCUMENTS

| JP | 63210689 A | * | 9/1988 |
|---|---|---|---|
| JP | 2003-299364 A | | 10/2003 |

* cited by examiner

*Primary Examiner*—Paresh Patel
(74) *Attorney, Agent, or Firm*—Sughrue Mion, PLLC

(57) ABSTRACT

In a Hall IC type current sensor of a vehicle-mounted power converter which includes a bus bar which supplies electricity to a vehicle-mounted power converter, a Hall IC which detects a current supplied to the bus bar, and a control board on which a control circuit which controls the vehicle-mounted power converter in response to an output of the Hall IC is mounted, the current sensor further includes a Hall IC holder which holds the Hall IC and is also fixed to the bus bar, and a through hole which is formed in the control board and which allows a lead terminal of the Hall IC to pass therethrough, and the lead terminal which passes through the through hole is connected with the control circuit by solder bonding.

5 Claims, 2 Drawing Sheets

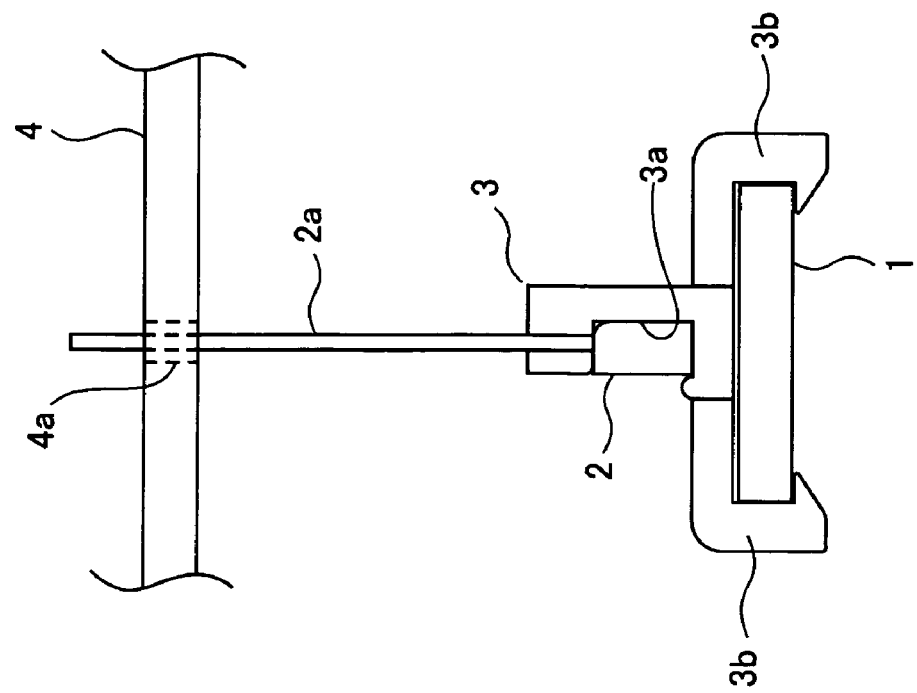
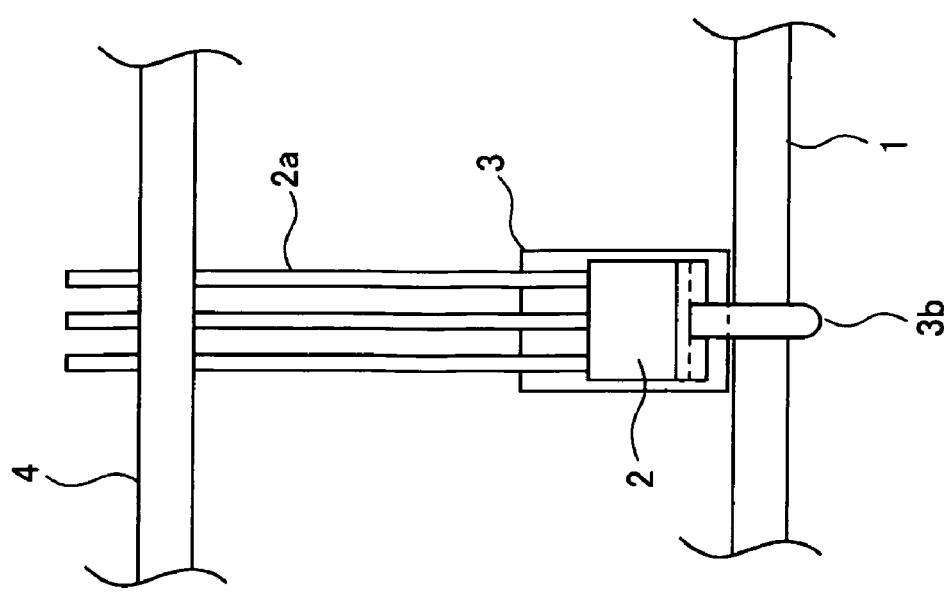

HALL IC TYPE CURRENT SENSOR OF VEHICLE-MOUNTED POWER CONVERTER

BACKGROUND OF THE INVENTION

1. Field of the Invention

The present invention relates to a Hall IC type current sensor of a vehicle-mounted power converter, particularly to the fixing structure of a Hall IC for detecting a current value of a bus bar for a large current and the connection structure of the Hall IC to a control board on which a control circuit for controlling a vehicle-mounted power converter is formed.

2. Description of the Related Art

A conventional current sensor for a large current which is used for a vehicle-mounted power converter is configured as follows. That is, a Hall IC having a printed circuit board on which a known Hall element, an electric circuit which amplifies an output signal of the Hall element and a constant current circuit are formed is fixed to a bus bar formed of a conductive member for supplying electricity to the vehicle-mounted power converter. Further, a lead terminal which supplies a power source to the Hall IC and a lead terminal which takes out an output signal from the Hall IC are connected with a control board on which a control circuit for controlling vehicle-mounted power converter is formed via connectors (see Japanese Unexamined Patent Publication 2003-299364 (paragraph 0020, FIG. 1).

In the device having such a constitution, the vehicle-mounted power converter is, for example, constituted of a semiconductor switching element, wherein the semiconductor switching element receives a DC power or an AC power from an external power source via a bus bar, and after power conversion, the electric power is supplied to a suitable electric load. Here, a magnetic flux is generated in a bus bar in the direction perpendicular to a flowing current and hence, a Hall element is mounted in the direction perpendicular to the magnetic flux on a magnetic circuit so as to convert the power into an electric signal corresponding to the density of magnetic flux, the electric signal is amplified by an electric circuit in the inside of the Hall IC and, at the same time, the electric current is transmitted to a control board via a lead terminal and a connector thus controlling the vehicle-mounted power converter in response to a current value of the bus bar.

The conventional current sensor for a large current has the above-mentioned constitution and the connection of the lead terminal of the Hall element and the control board is performed using the connector and hence, when such a current sensor is provided for a vehicle use which receives strong vibration, there has been a drawback that the current sensor lacks reliability in connectivity. Further, the current sensor for a large current is often large-sized and costly and hence, the current sensor is constituted of parts which largely obstruct the miniaturization and the reduction of cost which are requisite for the vehicle-use device which must be mounted in a limited space.

SUMMARY OF THE INVENTION

The present invention has been made to cope with such drawbacks and it is an object of the present invention to provide a Hall IC type current sensor of a vehicle-mounted power converter which can realize the reduction of cost and the miniaturization of the current sensor for a large current thus simplifying the assembling of the vehicle-mounted power converter.

The present invention is directed to a Hall IC type current sensor of a vehicle-mounted power converter which includes a bus bar which is connected with a power source and supplies electricity to a vehicle-mounted power converter, a Hall IC which measures a magnetic flux which is generated when electricity is supplied to the bus bar, outputs an electric signal in response to the density of the magnetic flux and detects a current supplied to the bus bar, and a control board on which a control circuit which controls the vehicle-mounted power converter in response to an output of the Hall IC is mounted, wherein the current sensor further includes a Hall IC holder which holds the Hall IC and is also fixed to the bus bar or the control board, and a through hole which is formed in the control board and which allows a lead terminal of the Hall IC to pass therethrough, and the lead terminal which passes through the through hole is connected with the control circuit by solder bonding.

Since the Hall IC type current sensor of a vehicle-mounted power converter according the present invention has the above-mentioned constitution, it is possible to reduce a size of the current sensor per se even with respect to the vehicle-mounted power converter for a large current and, further, since the connection of the sensor with the control board can be performed only by soldering, it is possible to expect the enhancement of assembling and the reduction of a cost attributed to the simplification of parts.

Still further, it is possible to perform the positioning of the bus bar and the Hall IC accurately and hence, it is possible to realize the reduction of cost and the miniaturization of the vehicle-mounted power converter.

BRIEF DESCRIPTION OF THE DRAWINGS

FIG. 1A and FIG. 1B are schematic views showing the constitution of an embodiment 1 of the present invention, wherein FIG. 1A is a front view and FIG. 1B is a side view.

FIG. 2A and FIG. 2B are schematic views showing hall IC type current sensor of a vehicle-mounted power converter according to an illustrative, non-limiting embodiment of the present invention, wherein FIG. 2A is a front view and FIG. 2B is a side view.

Figure 2B:
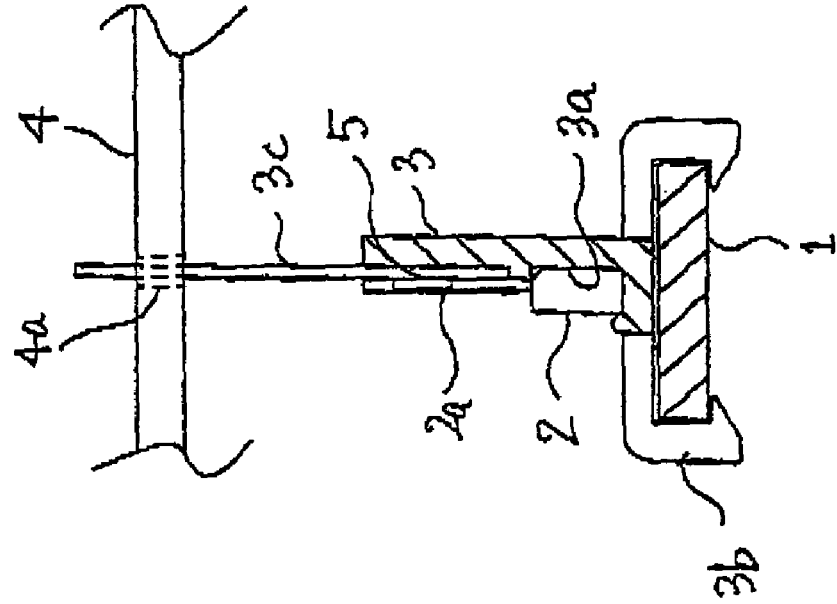

In the figures, the same numeric references denote analogous elements.

DETAILED DESCRIPTION OF THE INVENTION

Hereinafter, an embodiment 1 of the present invention is explained in conjunction with drawings. FIG. 1A and FIG. 1B are schematic views showing the constitution of an embodiment 1 of the present invention wherein FIG. 1A is a front view and FIG. 1B is a side view.

As shown in the drawing, a bus bar 1 which is formed of a conductive member is connected between an external power source not shown in the drawing and a semiconductor switching element which constitutes a vehicle-mounted power converter and the semiconductor switching element is configured to supply electric power to an appropriate electric load after power conversion.

The Hall IC 2 which detects a supply current to the bus bar 1 is fitted into and is held in a holding portion 3a formed in a side portion of a Hall IC holder 3 formed by resin molding, while a plurality of lead terminals 2a which supply a power source to the Hall IC 2 and take out an output signal from the Hall IC 2 are held by the Hall IC holder 3 in a state that the lead terminals 2a extend upwardly in FIG. 3.

Further, the Hall IC holder 3 includes a pair of fixing arms 3b which project in the frontward-and-backward direction, while distal end portions of the fixing arms 3b are, as shown in FIG. 1B, mounted on the bus bar 1 in a state that the distal end portions clamp both side portions of the bus bar 1 so as to enable the fixing of the distal end portions to the bus bar 1 at arbitrary positions thereof.

Here, in fixing the Hall IC holder 3 in the above-mentioned manner, the Hall IC 2 is determined to take a position in which the lead terminals 2a is arranged orthogonal to the direction of a magnetic flux generated by the supply current to the bus bar 1 and an electric signal corresponding to the magnetic flux can be taken out from the lead terminals 2a.

Further, in a control board 4 on which a control circuit (not shown in the drawing) for controlling a vehicle-mounted power converter in response to the supply current to the bus bar 1 is mounted, through holes 4a are formed, and the lead terminals 2a are allowed to pass through these through holes 4a to prevent the displacement of the lead terminals 2a due to vibration and, at the same time, and to bond the lead terminals 2a to the control circuit of the control board 4 by soldering.

Due to such a constitution, the Hall IC 2 outputs the electric signal corresponding to the supply current to the bus bar 1 and transmits the output to the control circuit of the control board 4, while the control circuit controls the vehicle-mounted power converter in response to the above-mentioned output.

Figure 2A:
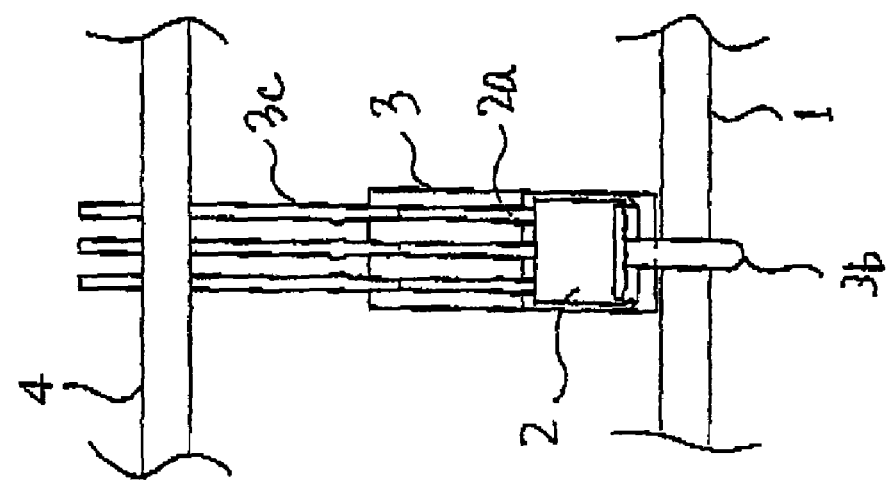

Further, depending on the positional relationship between the bus bar 1 and the control board 4, there may arise a case in which the lead terminals 2a of the Hall IC 2 do not directly reach the through holes 4a, as depicted in FIGS. 2A and 2B. In this case, a well-known lead frame 3c is preliminarily formed on the Hall IC holder 3 by insert molding, the lead terminals 2a of the Hall IC 2 which is held by the Hall IC holder 3 are electrically bonded to the lead frame 3c on the Hall IC holder 3 using suitable means such as soldering in a solder bonding portion 5, depicted in FIG. 2B, and, at the same time, extension portions of the lead frame 3c are allowed to pass through the through holes 4a formed in the control board 4 and are bonded to the control circuit by soldering.

Due to such a constitution, irrespective of the positions of the bus bar 1 and the control board 4, it is possible to electrically connect the lead terminals 2a of the Hall IC 2 and the control board 4.

Further, the Hall IC 2 per se may be formed by insert molding at the time of forming the Hall IC holder 3. Due to such a constitution, the number of man-hours for assembling can be reduced whereby the further reduction of the cost can be realized.

Although the above-mentioned explanation has been made with respect to the constitution in which the Hall IC holder 3 is fixed to the bus bar 1, the present invention is not limited to such a constitution. That is, it may be possible that the Hall IC holder 3 is fixed to the control board 4 by screws or the like, and the lead terminals 2a or the extension portions of the lead frame are allowed to pass through the through holes 4a and are bonded to the control circuit of the control board 4 by soldering.

Also in this case, by arranging the Hall IC 2 at the time of fixing the Hall IC holder 3 in a state that the Hall IC 2 is arranged in the direction orthogonal to the magnetic flux generated at the time of supplying electricity to the bus bar 1, it is possible to obtain an advantageous effect equal to the advantageous effects which are obtainable when the Hall IC holder 3 is fixed to the bus bar 1.

What is claimed is:

1. A Hall IC type current sensor of a vehicle-mounted power converter comprising:
    a bus bar which is connected with a power source and supplies electricity to a vehicle-mounted power converter;
    a Hall IC which measures a magnetic flux which is generated when electricity is supplied to the bus bar, outputs an electric signal in response to the density of the magnetic flux and detects a current supplied to the bus bar; and
    a control board on which a control circuit which controls the vehicle-mounted power converter in response to an output of the Hall IC is mounted, wherein
    the current sensor further includes
        a Hall IC holder which holds the Hall IC and is also fixed to the bus bar or the control board, and
        a through hole which is formed in the control board and which allows a lead terminal of the Hall IC to pass therethrough, and
        the lead terminal which passes through the through hole is connected with the control circuit by solder bonding.

2. A Hall IC type current sensor of a vehicle-mounted power converter according to claim 1, wherein the Hall IC is formed on the Hall IC holder by insert molding.

3. The Hall IC type current sensor according to claim 1, wherein the holder only holds the Hall IC.

4. The Hall IC type current sensor according to claim 1, wherein the holder holds the Hall IC by completely surrounding the Hall IC on at least two sides and wherein the holder has at least one fixing arm fixing the holder to the bus bar.

5. The Hall IC type current sensor according to claim 1, wherein the holder holds the Hall IC by surrounding the Hall IC on two sides and a portion of a third side but not on a fourth side.

* * * * *